(12) United States Patent
Kim

(10) Patent No.: US 7,842,582 B2
(45) Date of Patent: Nov. 30, 2010

(54) METHOD OF FORMING SEMICONDUCTOR DEVICES

(75) Inventor: Soo Jin Kim, Seoul (KR)

(73) Assignee: Hynix Semiconductor Inc. (KR)

( * ) Notice: Subject to any disclaimer, the term of this patent is extended or adjusted under 35 U.S.C. 154(b) by 60 days.

(21) Appl. No.: 12/468,666

(22) Filed: May 19, 2009

(65) Prior Publication Data

US 2010/0144113 A1    Jun. 10, 2010

(30) Foreign Application Priority Data

Dec. 4, 2008    (KR) .................. 10-2008-0122401

(51) Int. Cl.
*H01L 21/8238*    (2006.01)

(52) U.S. Cl. .............. 438/424; 438/230; 438/231; 438/232; 438/595; 257/E21.546; 257/374

(58) Field of Classification Search .............. 438/424, 438/230, 231, 232, 592, 595; 257/374, E21.546
See application file for complete search history.

(56) References Cited

U.S. PATENT DOCUMENTS

| | | | |
|---|---|---|---|
| 6,787,409 B2 * | 9/2004 | Ji et al. ................. | 438/221 |
| 2003/0211684 A1 * | 11/2003 | Guo .................... | 438/230 |
| 2010/0087043 A1 * | 4/2010 | Cheng et al. ........... | 438/424 |

* cited by examiner

*Primary Examiner*—Jarrett J Stark
*Assistant Examiner*—Wilner Jean Baptiste
(74) *Attorney, Agent, or Firm*—Marshall, Gerstein & Borun LLP

(57) ABSTRACT

A method of forming semiconductor devices includes providing a semiconductor substrate in which gate insulating patterns and first conductive patterns are formed, performing a first etch process to narrow a width of each of the first conductive patterns, forming an auxiliary layer on the first conductive patterns, the gate insulating patterns, and an exposed surface of the semiconductor substrate, and forming trenches by etching the auxiliary layer and the semiconductor substrate between the first conductive patterns.

23 Claims, 3 Drawing Sheets

METHOD OF FORMING SEMICONDUCTOR DEVICES

CROSS-REFERENCE TO RELATED APPLICATION

Priority to Korean patent application number 10-2008-0122401 filed on Dec. 4, 2008, the entire disclosure of which is incorporated by reference herein, is claimed.

BACKGROUND

One or more embodiments relate to a method of forming semiconductor devices and, more particularly, to a method of forming semiconductor devices, wherein trenches are formed for isolation.

Transistors included in a semiconductor device are formed on an active region. The active region is divided into trenches for isolation, and each of the trenches is filled with insulating material for providing insulation between neighboring active regions.

A NAND flash device, which is a type of nonvolatile device, is described below as an example.

A memory cell array of the NAND flash device includes a number of parallel strings. Each string is an active region, and a trench for isolation is formed between the strings. Here, with the high degree of integration of semiconductor devices, not only the width of the active region, but the width of the trench is narrowed. Accordingly, the aspect ratio within the trench increases, which gradually complicates a gap-fill process of filling the inside of the trench with insulating material.

Furthermore, with the high degree of integration of semiconductor devices, a gap between memory cells is also narrowed, which may result in an increased interference effect between the memory cells.

BRIEF SUMMARY

According to embodiment of the disclosure, after the width of a first conductive pattern for a floating gate is narrowed, an auxiliary layer is formed on the entire surface, including a first conductive pattern and an exposed surface of a semiconductor substrate, and an etch process is performed, thereby forming trenches. In this case, the top width of each trench may be larger than the bottom with of the trench because of the auxiliary layer.

In an embodiment of the disclosure, a method of forming semiconductor devices includes providing a semiconductor substrate in which gate insulating patterns and first conductive patterns are defined, performing a first etch process to narrow a width of each of the first conductive patterns, forming an auxiliary layer on the first conductive patterns, the gate insulating patterns, and an exposed surface of the semiconductor substrate, and forming trenches by etching the auxiliary layer and the semiconductor substrate between the first conductive patterns.

The first etch process preferably is performed using an isotropic etch process, and the isotropic etch process preferably is performed using a dry etch process employing a mixed gas of HBr, $Cl_2$, and $O_2$.

After formation of the trenches, isolation layers are formed within the respective trenches, a height of the isolation layers is lowered to expose a top of the first conductive patterns, and a dielectric layer and a second conductive layer are formed on a surface that includes the isolation layers and the first conductive patterns.

An etch process of removing the remaining auxiliary layer preferably is performed between formation of the trenches and formation of the isolation layers.

When the height of the isolation layers is lowered, a second etch process to remove the remaining auxiliary layer preferably is performed.

The auxiliary layer preferably is made of polymer, and the auxiliary layer preferably is formed using $CH_2F_2$ gas or $C_5F_8$ gas.

After the formation of the first etch process, a treatment process to compensate for etch damage to the first conductive patterns preferably is performed. The treatment process preferably is performed under an atmosphere including only $O_2$ gas or a mixed gas of HBr and $O_2$.

When the trenches are formed, the auxiliary layer preferably is fully removed or part of the auxiliary layer remains on sidewalls of the first conductive patterns.

In another embodiment of the disclosure, a method of forming semiconductor devices includes providing a semiconductor substrate in which gate insulating patterns and first conductive patterns are defined, performing a first etch process to narrow a width of each of the first conductive patterns, performing a second etch process to form trenches in the semiconductor substrate exposed along the first conductive patterns each having the narrowed width, forming auxiliary patterns on the trenches and the first conductive patterns, and increasing a depth of each of the trenches, thereby forming isolation regions.

The first etch process preferably is performed using an isotropic etch process, and the isotropic etch process preferably is performed using a dry etch process employing a mixed gas of HBr, $Cl_2$, and $O_2$.

The second etch process preferably is performed using an anisotropic etch process, and the anisotropic etch process preferably is performed using a mixed gas of HBr, $Cl_2$, and $O_2$.

After the first etch process and the second etch process are performed, a treatment process to compensate for damage to a surface of the first conductive patterns is performed. The treatment process preferably is performed using only a plasma source power and preferably is performed under an atmosphere including $O_2$ gas or a mixed gas of HBr and $O_2$. The first etch process, the second etch process, and the treatment process preferably are performed repetitively. The auxiliary patterns preferably are made of polymer.

If part of the auxiliary patterns remains before the isolation layers are formed, the remaining auxiliary patterns preferably are removed.

DESCRIPTION OF EMBODIMENT

Figure 1A:
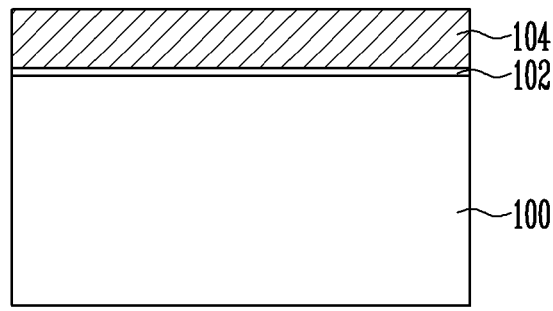
FIGS. 1A to 1H are sectional views illustrating a method of forming semiconductor devices according to an embodiment of the disclosure.

Hereinafter, the present disclosure will be described in detail in connection with an embodiment with reference to the accompanying drawings. The drawing figures are provided to allow those having ordinary skill in the art to understand the scope of an embodiment of the disclosure.

FIGS. 1A to 1H are sectional views illustrating a method of forming semiconductor devices according to an embodiment.

A NAND flash device is described as an example with reference to FIG. 1A.

A gate insulating layer 102 for tunneling of electrons is formed on a semiconductor substrate 100, and a first conductive layer 104 for a floating gate is formed on the gate insulating layer 102. The gate insulating layer 102 preferably is formed of an oxide layer, and the first conductive layer 104 preferably is formed of a polysilicon layer. In more detail, the first conductive layer 104 preferably is formed by sequentially stacking an undoped polysilicon layer and a doped polysilicon layer.

Figure 1B:
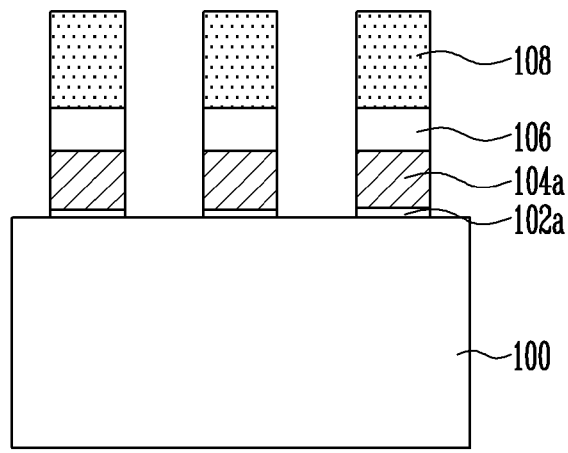

Referring to FIG. 1B, a gate mask layer 106 and a hard mask pattern 108 are sequentially formed over the first conductive layer (refer to 104 of FIG. 1A). The gate mask layer 106 preferably is formed of a nitride layer. The hard mask pattern 108 preferably is formed by sequentially stacking an oxide layer, an amorphous carbon layer, and an SION layer or sequentially stacking an oxide layer and an SION layer. An etch process is performed on the entire surface of the hard mask pattern 108, thereby patterning the gate mask layer 106. First conductive patterns 104a and gate insulating patterns 102a are formed by patterning the exposed first conductive layer (refer to 104 of FIG. 1A) and the exposed gate insulating layer (refer to 102 of FIG. 1A). The etch process preferably is performed using a dry etch process (for example, an anisotropic dry etch process) to prevent the deformation of a profile of the first conductive patterns 104a. The anisotropic dry etch process preferably is performed using a mixed gas of HBr, $Cl_2$, and $O_2$.

Figure 1C:
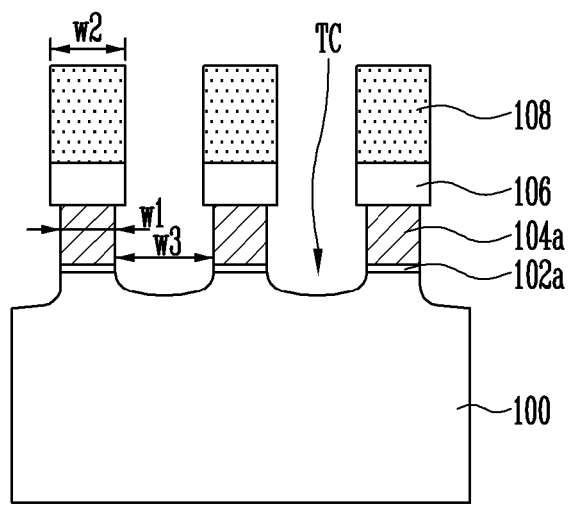

Referring to FIG. 1C, a first etch process is performed to narrow the width of each of the first conductive patterns 104a. In more detail, the first etch process preferably is performed using a dry etch process (for example, an isotropic dry etch process). The isotropic dry etch process preferably is performed using a mixed gas of HBr, $Cl_2$, and $O_2$. If the first etch process is performed, not only the width of each of the first conductive patterns 104a, but the width of each of the gate insulating patterns 102a is narrowed. A part of the semiconductor substrate 100 is also exposed, thereby forming trenches TC each having a shallow depth.

Since a width (W1) of the first conductive pattern 104a is narrower than a width (W2) of the hard mask pattern 108, a distance (W3) between the first conductive patterns 104a is widened. Accordingly, an interference effect between subsequent memory cells can be reduced.

After the width of the first conductive pattern 104a is narrowed, a treatment process preferably is performed to compensate for damage to the sidewalls of the first conductive patterns 104a, which is caused by the first etch process. The treatment process preferably is performed using only a plasma source power under an atmosphere including a mixed gas of $O_2$, or HBr and $O_2$.

Figure 1D:
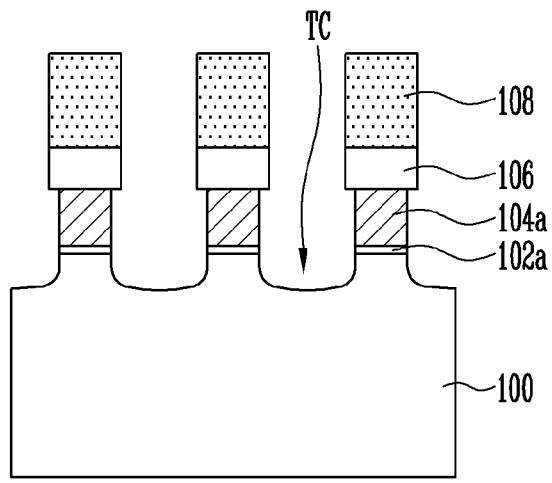

Referring to FIG. 1D, a second etch process is performed to increase the depth of the trench TC. The second etch process preferably is performed using a dry etch process (for example, an isotropic or anisotropic dry etch process). This treatment process preferably is performed after the second etch process has been completed because the sidewalls of the first conductive patterns 104a may be etched during the second etch process.

Each of the first etch process, the second etch process, and the treatment process preferably is performed several times to control the distance (W3) between the first conductive patterns 104a and the depth of the trench TC.

Figure 1E:
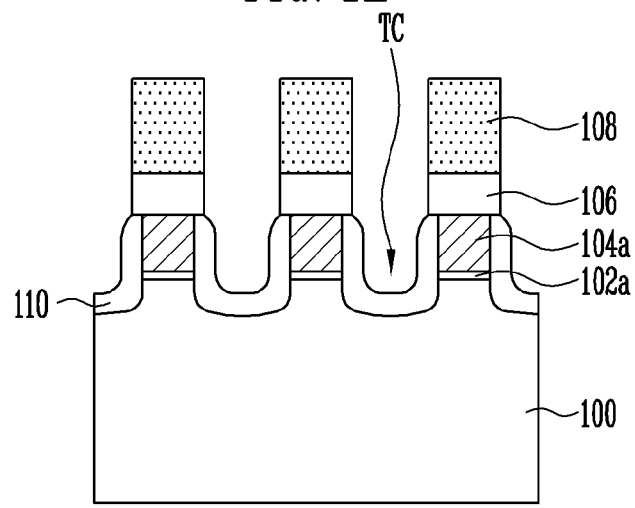

Referring to FIG. 1E, an auxiliary layer 110 is formed on the entire surface, including the first conductive patterns 104a and the trenches TC.

The auxiliary layer 110 is formed to differentiate the top and bottom widths of the trench TC for isolation and preferably is made of polymer (i.e., insulating material). A process of forming the auxiliary layer 110 using polymer preferably is performed in-situ together with the previous process. Any of various suitable methods of forming the auxiliary layer 110 may be utilized. For example, the auxiliary layer 110 preferably is formed using an etch gas (for example, $CH_2F_2$ gas or $C_5F_8$ gas). In more detail in this case, when $CH_2F_2$ gas or $C_5F_8$ gas is injected into a chamber in which the semiconductor substrate 100 is loaded, the $CH_2F_2$ gas or $C_5F_8$ gas reacts with the hard mask pattern 108, the gate mask layer 106, or the first conductive patterns 104a, to create a polymer. Here, the polymer is for the most part accumulates at the bottoms and on the lateral portions of the trenches TC, thereby forming the auxiliary layer 110.

Figure 1F:
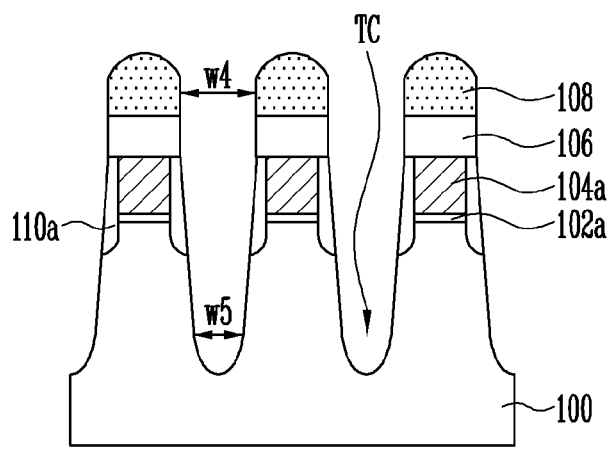

Referring to FIG. 1F, to form isolation regions, an etch process for increasing the depth of the trenches TC, each having a shallow depth, is performed. The etch process preferably is performed using an anisotropic dry etch process to etch the trench TC in a direction vertical with respect to the semiconductor substrate 100. The anisotropic dry etch process preferably is performed using a mixed gas of HBr, $Cl_2$, and $O_2$. If the anisotropic dry etch process is performed, the auxiliary layers (refer to 110 of FIG. 1D) formed at the bottoms of the trenches TC are removed anterior to the auxiliary layer (refer to 110 of FIG. 1D) formed on the sidewalls of the trenches TC, so auxiliary patterns 110a are formed. The semiconductor substrate 100 exposed along the auxiliary patterns 110a is removed to increase the depth of the trench TC. The auxiliary patterns 110a may function to protect the first conductive patterns 104a, the gate insulating patterns 102a, and part of the sidewalls of the trenches TC from the etch process. The auxiliary patterns 100a do not influence the electrical properties of the device, although they partially remain, but may be completely removed. That is, the auxiliary patterns 110a may be completely removed when the etch process of increasing the depth of the trench TC is performed, or the remaining auxiliary patterns 110a may be removed by further performing an etch process after the trenches TC are formed.

If the top width (W4) of the trench TC is wider than the bottom width (W5) thereof, a gap-fill process (refer to FIG. 1F) of filling the trenches with the insulating material for isolation layers may be easily performed.

Furthermore, a process of decreasing the depth of the trench TC may be repetitively performed by forming and etching the auxiliary layer (refer to 110 of FIG. 1D). In this case, since a difference between the bottom width (W5) and the top width (W4) of the trench TC can be further increased, a subsequent gap-fill process may be easily performed.

Figure 1G:
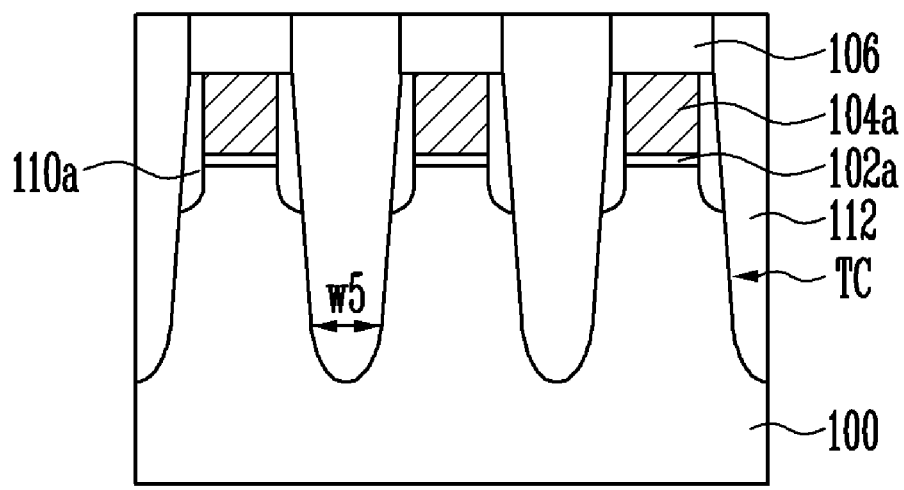

Referring to FIG. 1G, the trenches TC are filled with respective isolation layers 112. In more detail, to fully fill the trenches TC, insulating material for the isolation layers 112 is formed to cover all the hard mask patterns (refer to 108 of FIG. 1E). Next, the isolation layers 112 formed only within the respective trenches TC are formed by performing a polishing process to expose the gate mask layer 106.

The insulating material for the isolation layers 112 preferably comprises a high-density plasma (HDP) layer, a flowable spin-on glass (SOG) layer, or a tetraethyl orthosilicate (TEOS) layer. Here, an HDP layer, a flowable SOG layer, or a TEOS layer preferably is used either alone or stacked in combination.

Figure 1H:
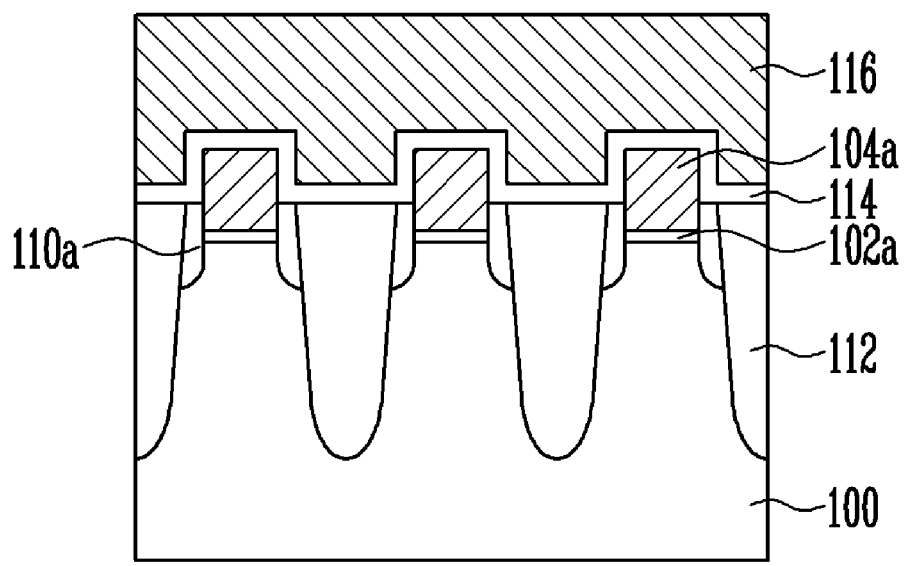

Referring to FIG. 1H, the effective field height (EFH) is controlled by performing an etch process to lower the height of the isolation layers 112. In this case, the height of the isolation layers 112 may be lowered after the gate mask layer (refer to 106 of FIG. 1F) is removed, or the gate mask layer (refer to 106 of FIG. 1F) may be removed after the height of the isolation layers 112 is lowered. At this time, since portion of the auxiliary patterns 110a is removed while the height of the isolation layers 112 is lowered, the tops of the first conductive patterns 104a are exposed. A dielectric layer 114 is formed on the entire surface, including the isolation layers 112, the auxiliary patterns 110a, and the first conductive patterns 104a. A second conductive layer 116 for a control gate control gate is formed on the dielectric layer 114. The dielectric layer 114 preferably is formed by stacking an oxide layer, a nitride layer, and an oxide layer. The second conductive layer 116 preferably is formed of a polysilicon layer.

According to one or more embodiments, after the width of the first conductive patterns for floating gates is narrowed, the auxiliary layer is formed on the entire surface, including the first conductive patterns and the exposed semiconductor substrate, and the trenches are formed by performing an etch process. At this time, since the auxiliary layer is patterned and therefore the auxiliary patterns remain on the sidewalls of the first conductive patterns, the top width of each of the trenches can be secured. Furthermore, when the etch process for performing the trenches is performed, the sidewalls of the first conductive patterns can be protected. Accordingly, the deterioration of the electrical properties of a memory cell can be prohibited.

What is claimed is:

1. A method of forming semiconductor devices, comprising:
   providing a semiconductor substrate defining gate insulating patterns and first conductive patterns;
   performing a first etch process to narrow a width of each of the first conductive patterns;
   forming an auxiliary layer on the first conductive patterns, the gate insulating patterns, and an exposed surface of the semiconductor substrate; and
   forming trenches by etching the auxiliary layer and the semiconductor substrate between the first conductive patterns.

2. The method of claim 1, wherein the first etch process is an isotropic etch process.

3. The method of claim 2, wherein the isotropic etch process is a dry process employing a mixed gas of HBr, $Cl_2$, and $O_2$.

4. The method of claim 1, further comprising, after forming the trenches:
   forming isolation layers within the respective trenches;
   lowering a height of the isolation layers to expose a top of the first conductive patterns; and
   forming a dielectric layer and a second conductive layer on the entire surface, including the isolation layers and the first conductive patterns.

5. The method of claim 4, further comprising performing a second etch process to remove the remaining auxiliary layer between forming the trenches and forming the isolation layers.

6. The method of claim 1, wherein the auxiliary layer comprises a polymer.

7. The method of claim 1, comprising forming the auxiliary layer using $CH_2F_2$ gas or $C_5F_8$ gas.

8. The method of claim 1, further comprising, after the first etch process, performing a treatment process of compensating for etch damage to the first conductive patterns.

9. The method of claim 8, comprising performing the treatment process under an atmosphere consisting of $O_2$ gas or a mixed gas of HBr and $O_2$.

10. The method of claim 1, wherein, when forming the trenches, the auxiliary layer is fully removed or part of the auxiliary layer remains on sidewalls of the first conductive patterns.

11. The method of claim 1, comprising performing the first etch process in a state which hard mask patterns for forming the first conductive patterns remain over the first conductive patterns.

12. A method of forming semiconductor devices, comprising:
   providing a semiconductor substrate defining gate insulating patterns and first conductive patterns;
   performing a first etch process to narrow a width of each of the first conductive patterns;
   performing a second etch process to form trenches in the semiconductor substrate exposed along the first conductive patterns each having the narrowed width;
   forming auxiliary patterns on the trenches and the first conductive patterns; and
   increasing a depth of each of the trenches, thereby forming isolation regions.

13. The method of claim 12, wherein the first etch process is an isotropic etch process.

14. The method of claim 13, wherein the isotropic etch process is a dry etch process employing a mixed gas of HBr, $Cl_2$, and $O_2$.

15. The method of claim 12, wherein the second etch process is an anisotropic etch process.

16. The method of claim 15, comprising performing the anisotropic etch process using a mixed gas of HBr, $Cl_2$, and $O_2$.

17. The method of claim 12, further comprising, after the first and second etch processes, performing a treatment process to compensate for damage to a surface of the first conductive patterns.

18. The method of claim 16, comprising performing the treatment process using only a plasma source power under an atmosphere consisting of $O_2$ gas or a mixed gas of HBr and $O_2$.

19. The method of claim 17, comprising repetitively performing the first etch process, the second etch process, and the treatment process.

20. The method of claim 12, wherein the auxiliary patterns are comprise a polymer.

21. The method of claim 12, comprising performing the first etch process in a state in which hard mask patterns for forming the first conductive patterns remain over the first conductive patterns.

22. The method of claim 12, further comprising forming isolation layers in the respective isolation regions by filling the isolation regions with insulating material.

23. The method of claim 22, further comprising, if part of the auxiliary patterns remains before the isolation layers are formed, performing removing the remaining auxiliary patterns.

* * * * *